(12) United States Patent  
Nakamura et al.

(10) Patent No.: US 11,742,278 B2  
(45) Date of Patent: Aug. 29, 2023

(54) WIRING SUBSTRATE, ELECTRONIC DEVICE, AND ELECTRONIC MODULE

(71) Applicant: KYOCERA Corporation, Kyoto (JP)

(72) Inventors: Kazushi Nakamura, Kyoto (JP); Hidehisa Umino, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 42 days.

(21) Appl. No.: 17/417,413

(22) PCT Filed: Oct. 31, 2019

(86) PCT No.: PCT/JP2019/042862  
§ 371 (c)(1),  
(2) Date: Jun. 23, 2021

(87) PCT Pub. No.: WO2020/137152  
PCT Pub. Date: Jul. 2, 2020

(65) Prior Publication Data  
US 2022/0077049 A1   Mar. 10, 2022

(30) Foreign Application Priority Data

Dec. 26, 2018 (JP) ................. 2018-242957

(51) Int. Cl.
| | |
|---|---|
| *H05K 1/11* | (2006.01) |
| *H01L 23/498* | (2006.01) |
| *H01L 23/13* | (2006.01) |
| *H01L 23/00* | (2006.01) |
| *H05K 1/02* | (2006.01) |
| *H05K 1/18* | (2006.01) |

(52) U.S. Cl.  
CPC ........ *H01L 23/49838* (2013.01); *H01L 23/13* (2013.01); *H01L 24/16* (2013.01); *H05K 1/0296* (2013.01); *H05K 1/115* (2013.01); *H05K 1/181* (2013.01); *H01L 2224/16227* (2013.01)

(58) Field of Classification Search  
CPC ... H01L 23/49838; H01L 23/13; H01L 24/16; H05K 1/181; H05K 1/0296; H05K 1/115  
USPC .......................................................... 361/783  
See application file for complete search history.

(56) References Cited

U.S. PATENT DOCUMENTS

2018/0116055 A1   4/2018  Murakami

FOREIGN PATENT DOCUMENTS

| JP | 2005-191097 A | 7/2005 |
|---|---|---|
| JP | 2013-232610 A | 11/2013 |
| JP | 2018-073905 A | 5/2018 |

*Primary Examiner* — Tremesha S Willis  
(74) *Attorney, Agent, or Firm* — Volpe Koenig

(57) ABSTRACT

A wiring substrate includes: an insulating substrate being shaped in a quadrangle in a plan view, including a mounting portion where an electronic component is mounted on a side of a principal surface of the insulating substrate, and having a recess on a side surface thereof; an inner surface electrode which is located on an inner surface of the recess; a via conductor which is located on a corner side of the insulating substrate in a perspective plan view and has both ends located in a thickness direction of the insulating substrate; and a wiring conductor, on the side of the principal surface of the insulating substrate, connecting the mounting portion, the inner surface electrode, and the via conductor, wherein, in a perspective plan view, the wiring conductor has a wiring conductor absent region which surrounds a region located between the mounting portion and the via conductor.

19 Claims, 8 Drawing Sheets

WIRING SUBSTRATE, ELECTRONIC DEVICE, AND ELECTRONIC MODULE

TECHNICAL FIELD

The present invention relates to a wiring substrate, an electronic device, and an electronic module.

BACKGROUND ART

Conventionally known is a wiring substrate in which an electronic component is mounted on a principal surface of an insulating substrate made of ceramics.

The wiring substrate has openings on a principal surface thereof and on a side surface thereof, and includes: an insulating substrate having a recess which is long in an edge direction; an inner surface electrode which is located on an inner surface of the recess; a wiring conductor which is located on the surface of the insulating substrate connected to the inner surface electrode and inside of the insulating substrate (see, for example, Japanese Patent Application Publication No. 2013-232610).

SUMMARY OF INVENTION

A wiring substrate of the present disclosure includes: an insulating substrate being shaped in a quadrangle in a plan view, including a mounting portion where an electronic component is mounted on a side of a principal surface of the insulating substrate, and having a recess on a side surface thereof; an inner surface electrode which is located on an inner surface of the recess; a via conductor which is located on a corner side of the insulating substrate in a perspective plan view and has both ends located in a thickness direction of the insulating substrate; and a wiring conductor, on the side of the principal surface of the insulating substrate, connecting the mounting portion, the inner surface electrode, and the via conductor with each other, wherein, in a perspective plan view, the wiring conductor has a wiring conductor absent region which surrounds a region located between the mounting portion and the via conductor.

An electronic device of the present disclosure includes: a wiring substrate having the above-described configuration; and an electronic component mounted on the wiring substrate.

An electronic module of the present disclosure includes: a module substrate having a connection pad; and an electronic device having the above-described configuration and being connected to the connection pad via a solder.

DESCRIPTION OF EMBODIMENTS

Figure 1A:
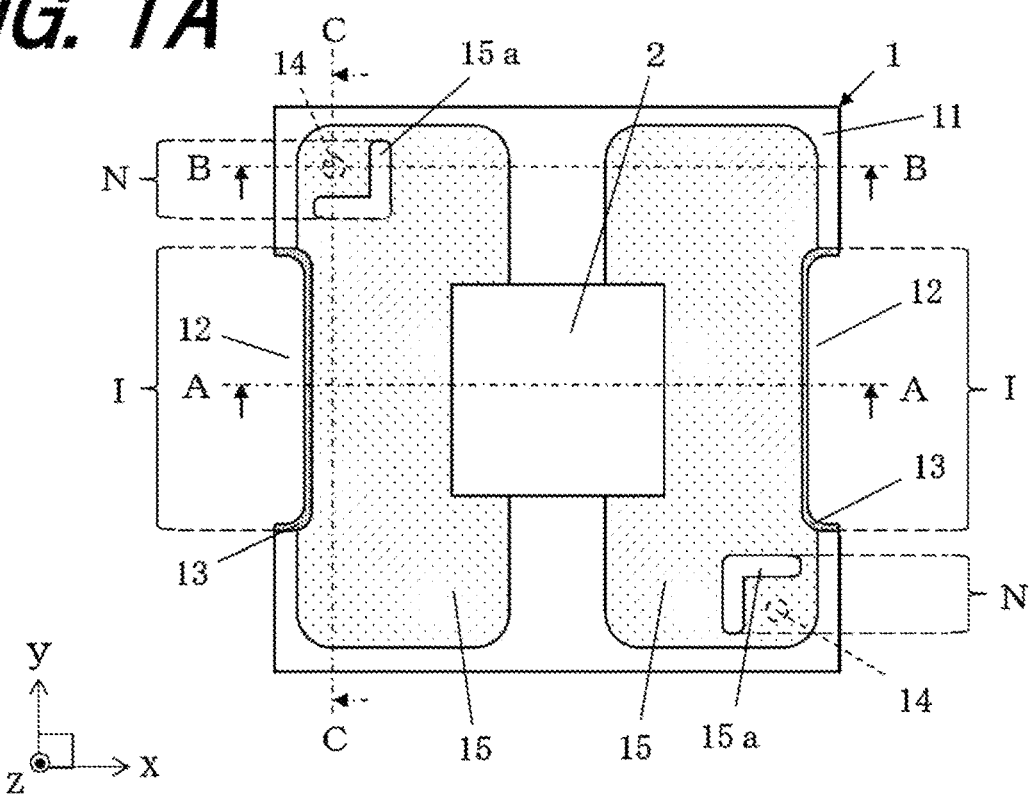
FIG. 1A is a top view illustrating an electronic device excluding a module substrate according to the first embodiment.

Some exemplary embodiments of the present disclosure will be described with reference to the accompanying drawings.

First Embodiment

A wiring substrate 1 according to the first embodiment, as in examples illustrated in FIGS. 1A to 2C, includes an insulating substrate 11, a recess 12 formed in the insulating substrate 11, an inner surface electrode 13 which is located on an inner surface of the recess 12, a via conductor 14 which is located in a thickness direction of the insulating substrate 11, and a wiring conductor 15 which is located on surfaces of the insulating substrate 11 and inside the insulating substrate 11. The insulating substrate 11 has a mounting portion 11a for mounting an electronic component 2 on a principal surface thereof in the center thereof in a plan view. An electronic device includes the wiring substrate 1 and the electronic component 2 which is mounted on the mounting portion 11a of the wiring substrate 1. For example, the electronic device is connected, by use of a joining material, to a connection pad 41 on a module substrate 4 that constitutes the electronic module.

The wiring substrate 1 according to the present embodiment includes: the insulating substrate 11 being shaped in a quadrangle in a plan view, including the mounting portion 11a where the electronic component 2 is mounted on a side of a principal surface of the insulating substrate 11, and having the recess 12 on a side surface thereof; the inner surface electrode 13 which is located on the inner surface of the recess 12; the via conductor 14 which is located on a corner side of the insulating substrate 11 in a perspective plan view and has both ends located in the thickness direction of the insulating substrate 11; and the wiring conductor 15, on the side of the principal surface of the insulating substrate 11, connecting the mounting portion 11a, the inner surface electrode 13, and the via conductor 14 with each other. In a perspective plan view, the wiring conductor 15 has a wiring conductor absent region 15a which surrounds a region located between the mounting portion 11a and the via conductor 14. In FIGS. 1A to 2C, an upward direction refers to a positive direction along an imaginary z axis. In the following description, discrimination between the upper and lower sides is merely for convenience, and it is not intended to limit the upper and lower sides when the wiring substrate 1 and other members are practically used.

Figure 1B:
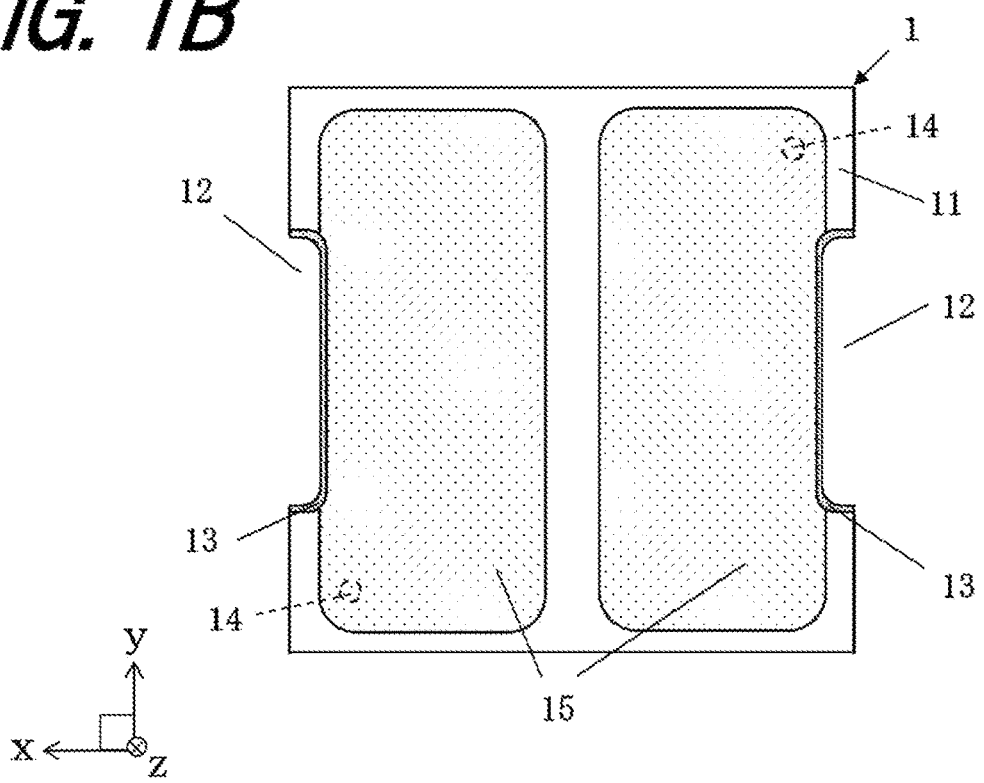
FIG. 1B is a bottom view of FIG. 1A.
Figure 2A:
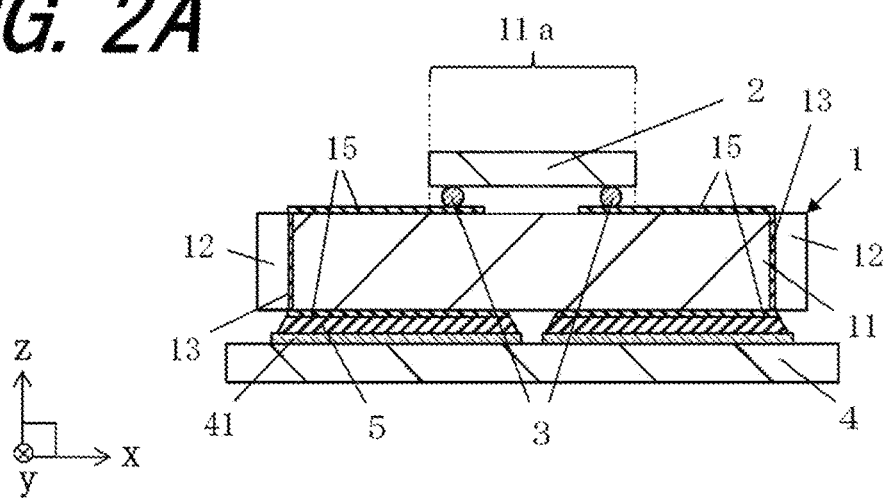
FIG. 2A is a cross-sectional view taken along the line A-A of an electronic module in which the electronic device illustrated in FIG. 1A is mounted on the module substrate.
Figure 2B:
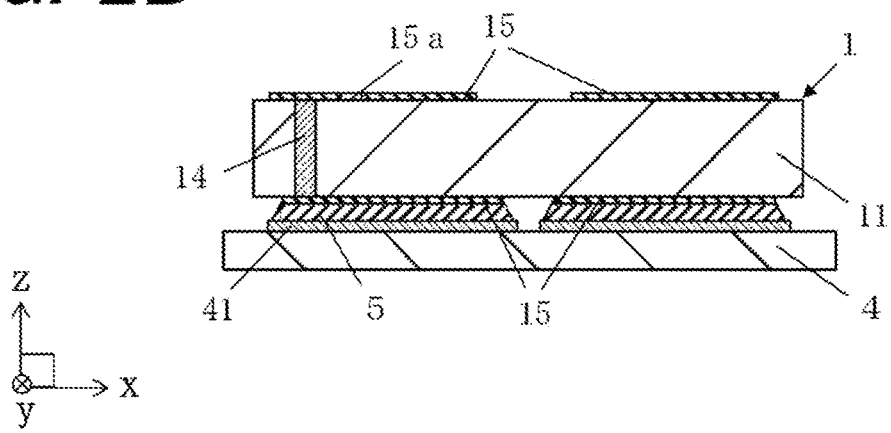
FIG. 2B is a cross-sectional view taken along the line B-B of an electronic module in which the electronic device illustrated in FIG. 1A is mounted on the module substrate.
Figure 2C:
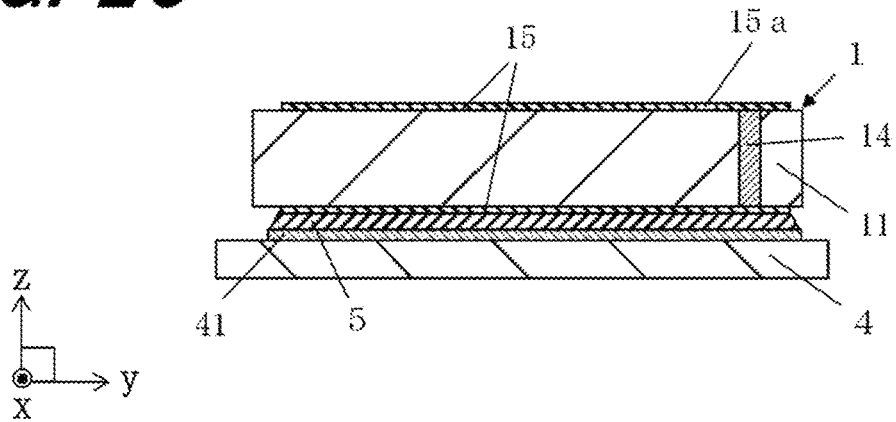
FIG. 2C is a cross-sectional view taken along the line C-C of an electronic module in which the electronic device illustrated in FIG. 1A is mounted on the module substrate.

The inner surface electrode 13 is indicated in half-tone dot meshing in the examples illustrated in FIG. 1A and FIG. 1B. With regard to the via conductor 14, a region where the side surface of the via conductor 14 and the wiring conductor 15 overlap is indicated by a dotted line in the examples illustrated in FIG. 1A and FIG. 1B. The wiring conductor 15 is indicated in half-tone dot meshing in the examples illustrated in FIG. 1A and FIG. 1B.

The insulating substrate 11 has a first principal surface (upper surface in FIGS. 1A to 2C), a second principal surface (lower surface in FIGS. 1A to 2C) opposite to the first principal surface, and side surfaces. The insulating substrate 11 is composed of a plurality of insulating layers and has the recess 12 which is located on a side surface thereof in a plan view and which is long in an edge direction. The insulating substrate 11 is shaped in a quadrangle in a plan view, i.e. when viewed from a direction perpendicular to the principal surfaces. The insulating substrate 11 functions as a support body for supporting the electronic component 2. In the center of the insulating substrate 11, the mounting portion 11a is located for mounting the electronic component 2 therein in a plan view.

The insulating substrate 11 may use, for example, ceramics, such as an aluminum oxide sintered body (alumina ceramic), an aluminum nitride sintered body, silicon nitride sintered body, a mullite sintered body, or a glass-ceramic sintered body. In a case where the insulating substrate 11 is, for example, an aluminum oxide sintered body, a slurry is prepared by adding, for example, an appropriate organic binder and a solvent to raw-material powder of, for example, aluminum oxide ($Al_2O_3$), silicon oxide ($SiO_2$), magnesium oxide (MgO), or calcium oxide (CaO), and mixing them together. The above slurry is formed in a sheet-like shape by employing a known doctor blade method or a known calendar roll method, so that a ceramic green sheet is formed. Then, the ceramic green sheet is appropriately punched, a plurality of the ceramic green sheets are laminated, so that a green body is formed. The green body is fired at a high temperature (approximately 1400° C.), so that an insulating substrate 11 is formed.

The recess 12 is located on the side surface of the insulating substrate 11 in an edge part of the insulating substrate 11. The recess 12, as in the examples illustrated in FIG. 1A and FIG. 1B, is shaped in a rectangle with arc-shaped corners in a plan view. The recess 12 may be shaped in a semi-ellipse or a semi-oval or shaped in a rectangle having a plurality of steps, in a plan view. The recess 12 is formed to be long along the direction of an edge of the insulating substrate 11, and have a width that is larger than a depth thereof. The recess 12 may be located from one principal surface of the insulating substrate 11 to the other principal surface, or may be located from the middle of the side surface of the insulating substrate 11 to the other principal surface. The above recess 12 is formed by forming, in some of ceramic green sheets for the insulating substrate 11, some through holes, which serve as the recess 12, by laser processing, punching with a die, or other processing.

The inner surface electrode 13, as in the examples illustrated in FIGS. 1A to 2C, is located on an inner surface of the recess 12 and is located in the thickness direction of the insulating substrate 11. The via conductor 14, as in the examples illustrated in FIGS. 1A to 2C, is located on a corner side of the insulating substrate 11 and is located in the thickness direction of the insulating substrate 11. The wiring conductor 15 is located on the principal surfaces of the insulating substrate 11 and inside the insulating substrate 11. The wiring conductor 15 is located on the principal surfaces of the insulating substrate 11 in the examples illustrated in FIGS. 1A to 2C. The inner surface electrode 13 and the via conductor 14 are electrically connected to the wiring conductor 15 as in the examples illustrated in FIGS. 1A to 2C. The inner surface electrode 13, the via conductor 14, and the wiring conductor 15 are the ones for electrically connecting the electronic component 2 mounted on the wiring substrate 1 with the module substrate 4 which is provided outside the wiring substrate 1.

The inner surface electrode 13, the via conductor 14, and the wiring conductor 15 are made of metallized powder containing tungsten (W), molybdenum (Mo), manganese (Mn), silver (Ag), or copper (Cu). In a case where a refractory metal material such as W or Mo is used, the refractory metal material may be mixed or alloyed with, for example, Cu.

The inner surface electrode 13 or the wiring conductor 15 is formed by, for example, applying a metallized paste for the wiring conductor 15 on the ceramic green sheet for the insulating substrate 11 by a printing method such as screen printing, and firing the paste together with the ceramic green sheet for the insulating substrate 11. Further, the via conductor 14 is formed by, for example, punching the ceramic green sheet for the insulating substrate 11 by using a processing method, such as punching with a die or a puncher, or laser processing, to form a through hole for the via conductor 14, filling the through hole with a metallized paste for the via conductor 14 by the printing method, and firing the paste with the ceramic green sheet for the insulating substrate 11. The metallized paste is prepared by adding an appropriate solvent and a binder to the above-described metal powder and kneading the mixture so that the viscosity of the mixture is adjusted to an appropriate viscosity. The metallized paste may contain glass powder or ceramic powder to increase the joining strength with respect to the insulating substrate 11.

In a perspective plan view, as in the examples illustrated in FIGS. 1A to 2C, the wiring conductor 15 has the wiring conductor absent region 15a which surrounds a region located between the mounting portion 11a and the via conductor 14. The wiring conductor absent region 15a, in a perspective plan view, is located on an imaginary line that connects the mounting portion 11a and the via conductor 14. The wiring conductor absent region 15a of the wiring conductor 15 can be formed by, in applying a metallized paste for the wiring conductor 15 on the ceramic green sheet for the insulating substrate 11 by a printing method such as screen printing, avoiding the metallized paste for the wiring conductor 15 from being applied to the wiring conductor absent region 15a.

Exposed surfaces of the inner surface electrode 13 and the wiring conductor 15 from the insulating substrate 11 are coated with a metal-plating layer by an electroplating method or an electroless plating method. The metal-plating layer is made of a metal having excellent corrosion resistance and excellent connection member connectivity, such as nickel, copper, gold, or silver. For example, the exposed surfaces of the inner surface electrode 13 and the wiring conductor 15 from the insulating substrate 11 are coated sequentially with a nickel-plating layer having a thickness of about 0.5 µm to 5 µm and a gold-plating layer having a thickness of about 0.1 µm to 3 µm. The above configuration enables effective prevention of corrosion of the inner surface electrode 13 and the wiring conductor 15 and enables strengthening of joining of the wiring conductor 15 to a connecting member 3 such as a bonding wire and strengthening of joining of the inner surface electrode 13 and the wiring conductor 15 to a connection pad 41 for connection formed on the module substrate 4.

The metal-plating layer is not limited to the metal-plating layer including the nickel-plating layer and the gold-plating layer, and may be another metal-plating layer including a nickel-plating layer, a palladium-plating layer, a gold-plating layer, and other layer.

An electronic device can be fabricated by mounting the electronic component 2 on the mounting portion 11a which is located in the center of the wiring substrate 1. The electronic element 2 mounted on the wiring substrate 1 is a semiconductor element such as an IC chip or an LSI chip; an imaging element such as a charge coupled device (CCD) imaging element and a complementary metal oxide semiconductor (CMOS) imaging element; a light-emitting element such as a laser diode (LD) and a light emitting diode (LED); and a light-receiving element such as a photo diode (PD). For example, in a case where the electronic component 2 is a flip-chip electronic component 2, the electronic component 2 is mounted on the wiring substrate 1 by electrically and mechanically connecting an electrode of the electronic component 2 with the wiring conductor 15 via a connecting member 3, such as a solder bump, a gold bump, or an electrically conductive resin (such as an anisotropic electrically-conductive resin). For another example, in a case where the electronic component 2 is a wire-bonding semiconductor element, the semiconductor element is mounted on the wiring substrate 1 by fixing the semiconductor element onto the mounting portion 11a of the wiring substrate 1 by using a joining member, such as a low-melting brazing material or an electrically conductive resin, and then electrically connecting an electrode of the semiconductor element with the wiring conductor 15 via a connecting member 3 such as a bonding wire. With the above configuration, the electronic component 2 is electrically connected to the conductor layer 15. A plurality of electronic components 2 may be mounted on the mounting portion 11a of the wiring substrate 1, and, if necessary, a small electronic component such as a resistance element or a capacitance element may be mounted on the mounting portion 11a of the wiring substrate 1. The electronic component 2 is sealed with a sealant made of a material such as resin or glass or with, for example, a lid body made of a material such as resin, glass, ceramic, or metal, if necessary.

A plurality of electronic components 2 may be mounted on the mounting portion 11a of the wiring substrate 1, and, if necessary, a small electronic component, such as a resistance element or a capacitance element, and another component such as a mirror may be mounted around the electronic component(s) 2. In a case where a plurality of electronic components 2 are mounted on the mounting portion 11a of the wiring substrate 1, a region surrounding a plurality of electronic components 2 in a plan view may be regarded as the mounting portion 11a. The electronic component 2 is sealed with a sealant made of a material such as resin or glass or with, for example, a lid body made of a material such as resin, glass, ceramic, or metal if necessary.

The wiring conductor of the electronic device according to the present embodiment is connected to, for example, the connection pad 41 of the module substrate 4 via the solder 5, thereby forming an electronic module. The electronic device is such that the inner surface electrode 13, which is located on the inner surface of the recess 12, and the wiring conductor 15, which is located on the lower surface of the wiring substrate 1, are connected to the connection pad 41 of the module substrate 4.

A wiring substrate according to the present embodiment includes: the insulating substrate 11 being shaped in a quadrangle in a plan view, including the mounting portion 11a where the electronic component 2 is mounted on a side of a principal surface of the insulating substrate 11, and having the recess 12 on a side surface thereof; the inner surface electrode 13 which is located on the inner surface of the recess 12; the via conductor 14 which is located on a corner side of the insulating substrate 11 in a perspective plan view and has both ends located in a thickness direction of the insulating substrate 11; and the wiring conductor 15, on the side of the principal surface of the insulating substrate 11, connecting the mounting portion 11a, the inner surface electrode 13, and the via conductor 14 with each other, wherein, in a perspective plan view, the wiring conductor 15 has a wiring conductor absent region 15a which surrounds a region located between the mounting portion 11a and the via conductor 14. The above configuration allows heat of the electronic component 2 transferred through the wiring conductor 15 to be diffused and easily transferred in different directions toward the inner surface electrode 13 and toward the via conductor 14 and allows heat to be more easily transferred to the recess 12 side, while preventing heat transfer to a via conductor 14 side. This makes it possible to effectively prevent cracks from being produced between the inner surface electrode 13 and the via conductor 14, over a long-term use, due to heat transfer to the wiring conductor 15, the inner surface electrode 13, and the via conductor 14, and application of a current thereto.

Further, a configuration in which, in a perspective plan view, the wiring conductor 15 is located in a region, on the corner side of the insulating substrate 11, where the via conductor 14 is located, allows heat transferring in the wiring conductor 15 to be transferred to a side where there are two sides forming the corner of the insulating substrate 11. This makes it possible to effectively prevent cracks from being produced between the inner surface electrode 13 and the via conductor 14 over a long-term use.

Further, as in the examples illustrated in FIGS. 1A to 2C, in a perspective plan view, the inner surface electrode 13 has a first part I along one edge of the insulating substrate 11, and the first part I and an imaginary extension region N formed by extending the wiring conductor absent region 15a to the side of one edge do not overlap. Since such an arrangement allows the inner surface electrode 13 not to be located between the via conductor 14 and an outer edge of the insulating substrate 11, it is possible to effectively prevent cracks from being produced between the inner surface electrode 13 and the via conductor 14 even if the amount of heat transferred to the via conductor 14 increases over a long-term use. Note that the phrase that the first part I and the imaginary extension region N formed by extending the wiring conductor absent region 15a to the side of one edge do not overlap indicates that, as in the examples illustrated in FIGS. 1A to 2C, the wiring conductor absent region 15a, when the wiring substrate 1 is viewed from the side surface thereof, is located on the principal surface of the insulating substrate 11 between the corner of the wiring substrate 1 and a cutout 12 thereof and does not overlap the inner surface electrode 13.

Further, on the opposite side with respect to the mounting portion 11a from the recess 12, the inner surface electrode 13, the via conductor 14 (first via conductor), the wiring conductor 15 (first wiring conductor), and the wiring conductor absent region 15a (first wiring conductor absent region 15a), are located another recess 12, another inner surface electrode 13, another via conductor 14 (second via conductor), another wiring conductor 15 (second wiring conductor), and another wiring conductor absent region 15a (second wiring conductor absent region 15a). This prevents heat of the electronic component 2 transferred through the wiring conductor 15 to be transferred to the via conductors 14 (first via conductor and second via conductor), which are located at positions far from each other. This makes it possible to effectively prevent cracks from being produced between the inner surface electrode 13 and the via conductor 14 over a long-term use.

Further, the thermal conductivity of the inner surface electrode 13 may be made higher than the thermal conductivity of the via conductor 14. The above arrangement allows heat to be more easily transferred to the inner surface electrode 13 side on the recess 12 side, while preventing heat transfer to the via conductor 14 side. This makes it possible to effectively prevent cracks from being produced between the inner surface electrode 13 and the via conductor 14, over a long-term use, due to heat transfer to the wiring conductor 15, the inner surface electrode 13, and the via conductor 14 and application of a current thereto. The thermal conductivity of the inner surface electrode 13 may be made higher than the thermal conductivity of the via conductor 14, by arranging the inner surface electrode 13 and the via conductor 14, for example, such that the inner surface electrode 13 is a metal conductor made of copper, or a mixed metal conductor made of copper and tungsten or molybdenum, and the via conductor 14 is a metal conductor made of tungsten or molybdenum. Alternatively, the thermal conductivity of the inner surface electrode 13 may be made higher than the thermal conductivity of the via conductor 14 by setting the content of the glass powder and ceramic powder contained in the inner surface electrode 13 to be lower than the content of the glass powder and ceramic powder contained in the via conductor 14.

The electronic device includes the wiring substrate 1 having the above-described configuration and the electronic component 2 mounted on the wiring substrate 1. This allows the electronic device to be a compact, highly functional electronic device having excellent long-term reliability.

The electronic module includes: the module substrate 4 having the connection pad 41; and the electronic device having the above-described configuration and being connected to the connection pad 41 via the solder 5. The configuration in which the electronic module has the device and the module substrate 4 to which the electronic device is connected allows the electronic module to have excellent long-term reliability.

Second Embodiment

Next, a wiring substrate 1 according to the second embodiment will be described with reference to FIGS. 3A to 5C.

The wiring substrate 1 according to the second embodiment differs from the wiring substrate 1 according to the above-described embodiment in that a plurality of via conductors 14 are located along an outer edge of a wiring conductor absent region 15a in a perspective plan view.

Figure 3A:
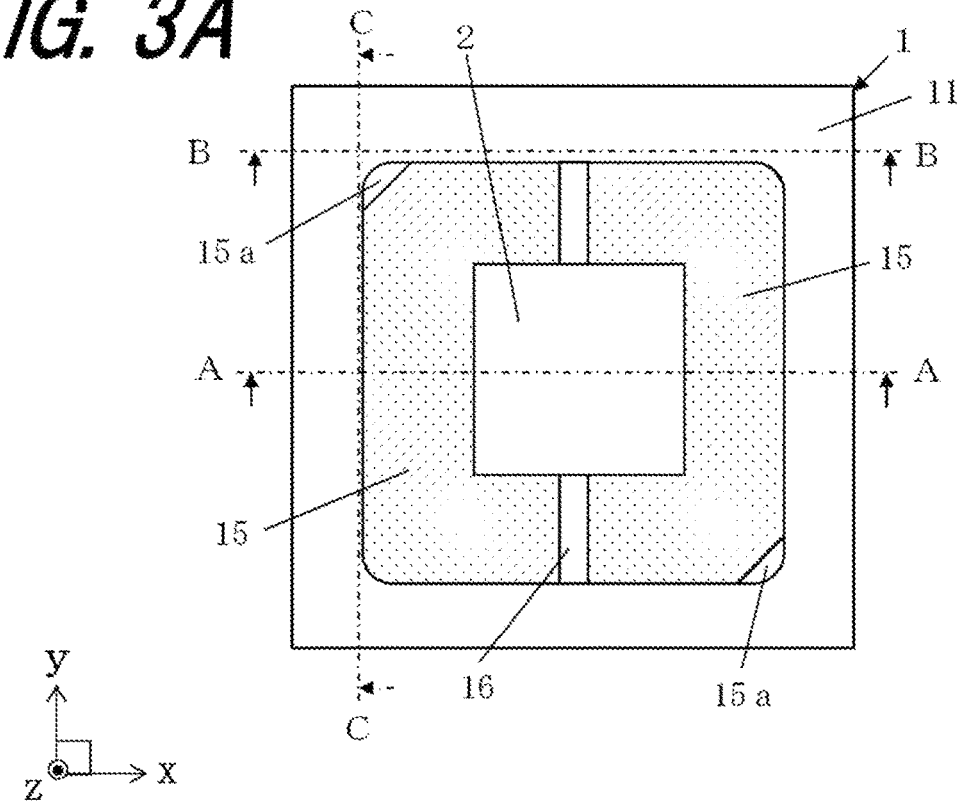
FIG. 3A is a top view illustrating an electronic device according to the second embodiment.
Figure 3B:
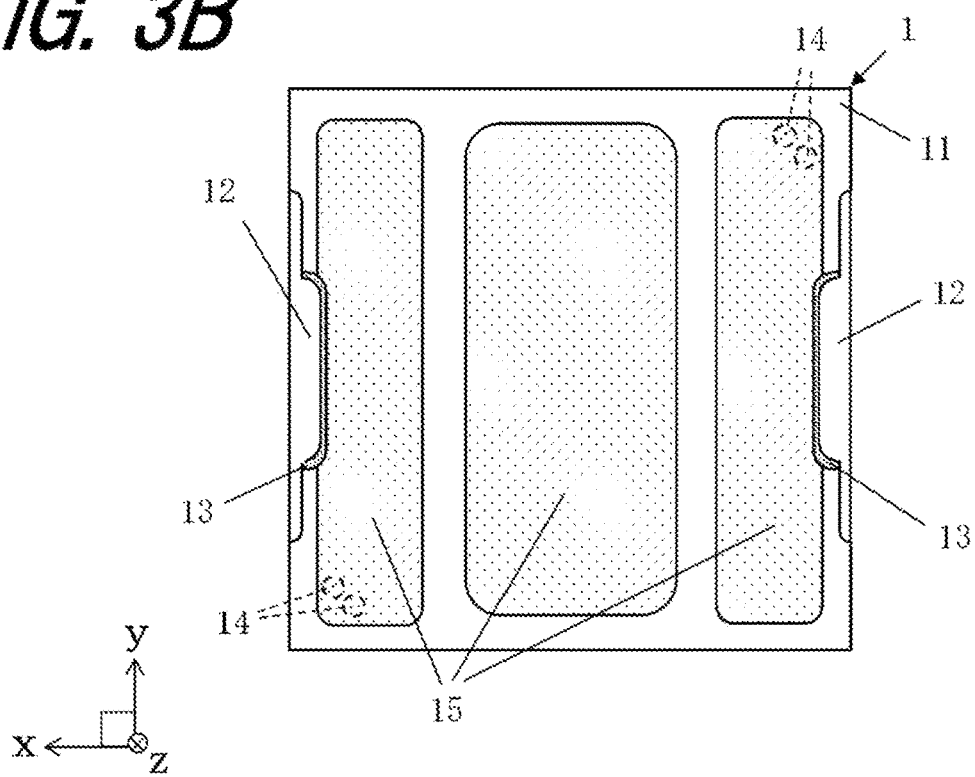
FIG. 3B is a bottom view of FIG. 3A.
Figure 4A:
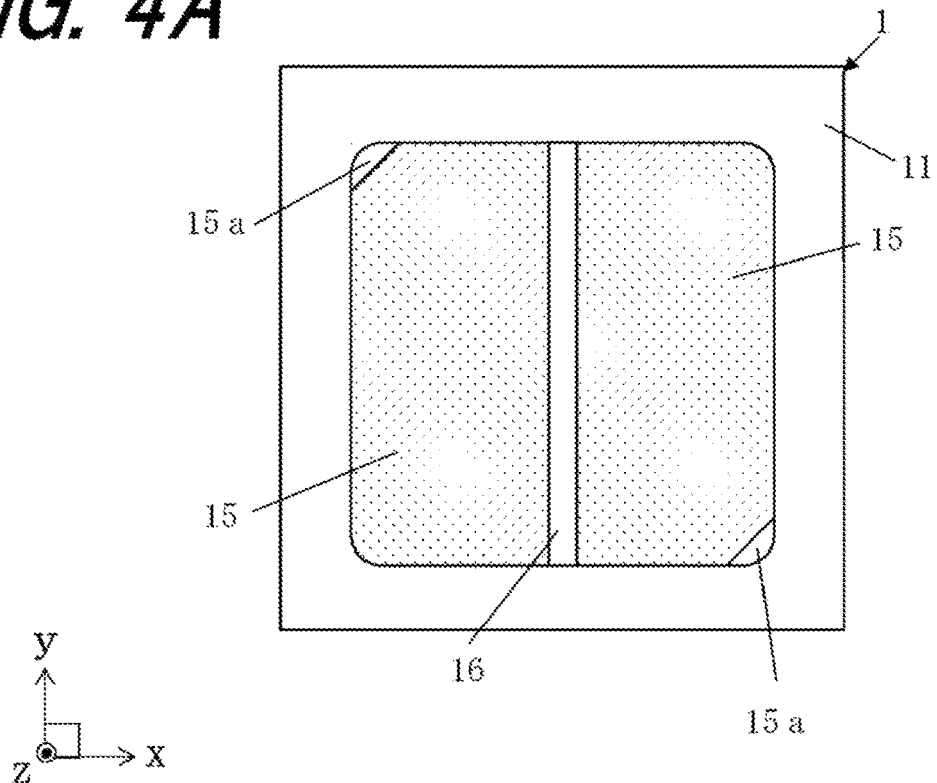
FIG. 4A is a top view illustrating a wiring substrate in the electronic device illustrated in FIGS. 3A and 3B.
Figure 4B:
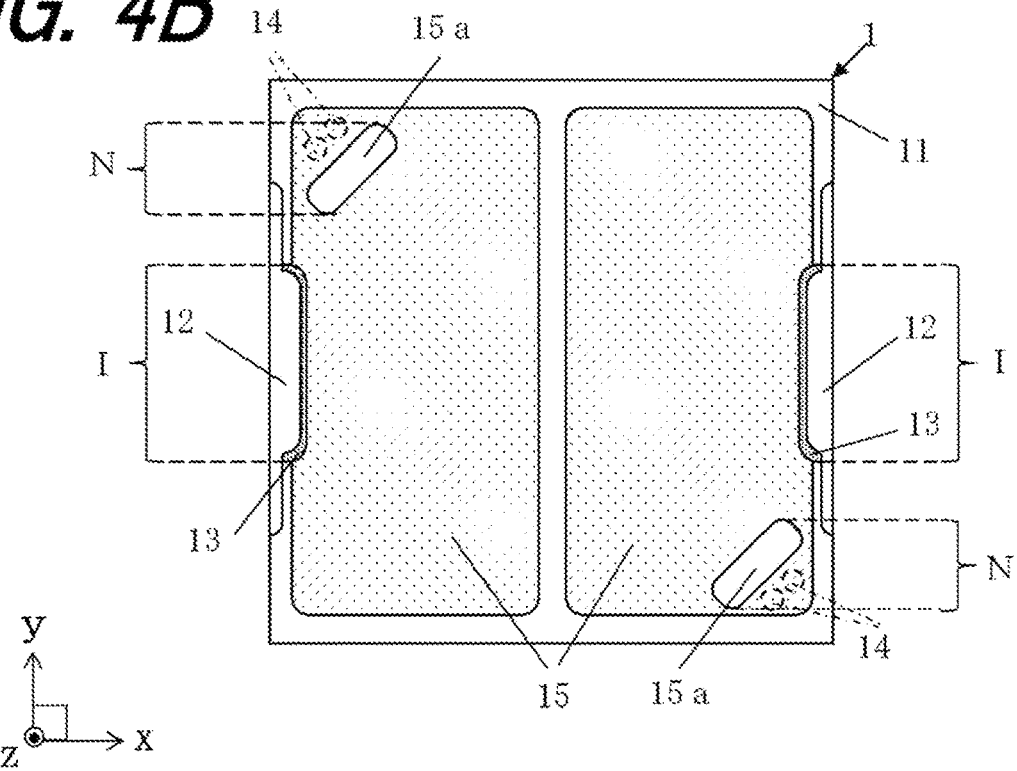
FIG. 4B is an internal top view of a wiring substrate in the electronic device illustrated in FIGS. 3A and 3B.
Figure 5A:
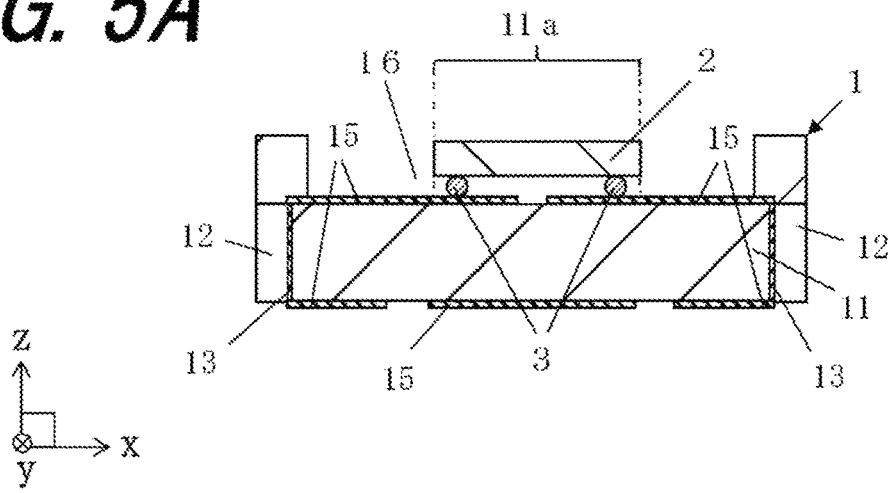
FIG. 5A is a cross-sectional view taken along the line A-A of the electronic device illustrated in FIG. 3A.
Figure 5B:
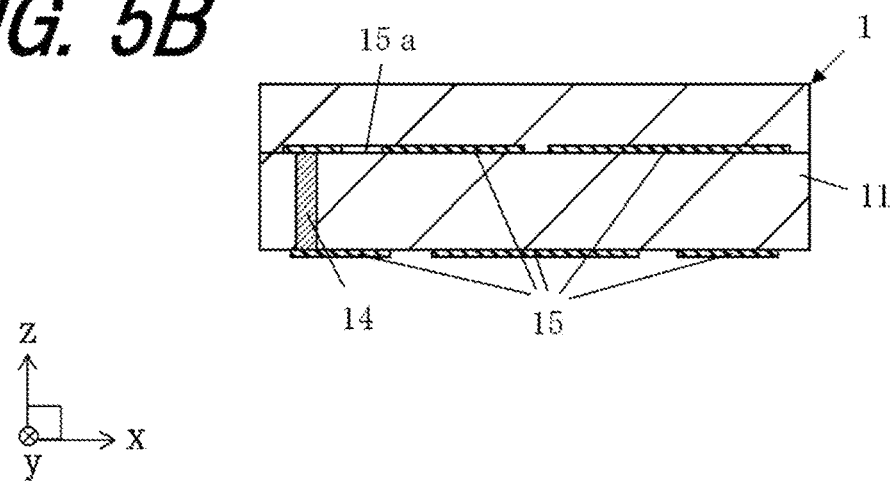
FIG. 5B is a cross-sectional view taken along the line B-B of the electronic device illustrated in FIG. 3A.
Figure 5C:
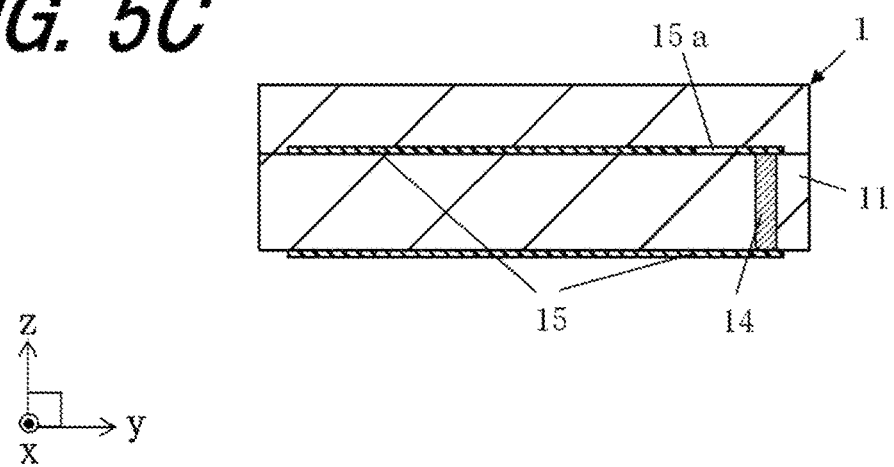
FIG. 5C is a cross-sectional view taken along the line C-C of the electronic device illustrated in FIG. 3A.

The inner surface electrode 13 is indicated in half-tone dot meshing in the examples illustrated in FIG. 3B and FIG. 4B. With regard to the via conductors 14, regions where the side surfaces of the via conductors 14 and a wiring conductor 15 overlap are indicated by a dotted line in the examples illustrated in FIG. 3B and FIG. 4B. The wiring conductor 15 is indicated in half-tone dot meshing in the examples illustrated in FIG. 3A and FIG. 4B.

The wiring substrate 1 according to the second embodiment, as in the case of the wiring substrate 1 according to the above-described embodiment, allows heat of the electronic component 2 transferred through the wiring conductor 15 to be diffused and easily transferred in different directions toward the inner surface electrode 13 and toward the via conductor 14 and allows heat to be more easily transferred to the recess 12 side, while preventing heat transfer to the via conductor 14 side. This makes it possible to effectively prevent cracks from being produced between the inner surface electrode 13 and the via conductor 14, over a long-term use, due to heat transfer to the wiring conductor 15, the inner surface electrode 13, and the via conductor 14, and application of a current thereto.

Further, a configuration in which, in a perspective plan view, each of the via conductors 14 is located on a corresponding one of sides where edges forming corners of the insulating substrate 11 are provided disperses heat transfer from the wiring conductor 15 to the via conductor 14 side. This makes it possible to effectively prevent cracks from being produced between the inner surface electrode 13 and the via conductor 14 over a long-term use.

Further, a configuration in which a plurality of via conductors 14 are located along the outer edge of the wiring conductor absent region 15a disperses heat transfer to the sides of the individual via conductors 14, allows heat transfer to the sides of the via conductors 14 through the wiring conductor 15 along the outer edge of the wiring conductor absent region 15a to be more easily dispersed, and prevents heat transfer to the via conductors 14 sides each of which is close to the recess 12 side. This makes it possible to effectively prevent cracks from being produced between the inner surface electrode 13 and the via conductor 14 over a long-term use.

Further, in the examples illustrated in FIGS. 3A to 5C, two via conductors 14 are located along the outer edge of the wiring conductor absent region 15a. Three or more via conductors 14 may be located along the outer edge of the wiring conductor absent region 15a.

Further, in a case where the plurality of via conductors 14 are located along the outer edge of the wiring conductor absent region 15a, as in the examples illustrated in FIGS. 3A to 5C, the via conductors 14 on one side where the recess 12, the inner surface electrode 13, the via conductor 14, the wiring conductor 15, and the wiring conductor absent region 15a are located may be equal in number to the via conductors 14 on the other side, opposite to the one side with respect to the mounting portion 11a, where the recess 12, the inner surface electrode 13, the via conductor 14, the wiring conductor 15, and the wiring conductor absent region 15a are located.

Further, the wiring substrate 1 has, on an upper surface thereof, a cavity 16 for accommodating an electronic component 2. In the above configuration, the wiring conductor absent region 15a of the wiring conductor 15, as in the examples illustrated in FIGS. 3A to 5C, may be such that, in a plan view, a portion of the wiring conductor absent region 15a is located inward of the inner surface of the cavity 16 and is exposed. A configuration, as in the above configuration, in which a portion of the wiring conductor absent region 15 of the wiring conductor 15 is exposed provides good lamination of an upper surface-side layer of the insulating substrate 11 and a lower surface-side layer thereof at the corners of the cavity 16, provides good heat transfer to side-wall sides of the cavity 16 in the vicinity of the wiring conductor absent region 15, and prevents heat transfer to the via conductor 14 side. This makes it possible to effectively prevent cracks from being produced between the inner surface electrode 13 and the via conductor 14, over a long-term use.

Except for the points described above, the wiring substrate 1 according to the second embodiment can be manufactured by using a manufacturing method which is the same as the manufacturing method of the wiring substrate 1 according to the above-described embodiment.

Third Embodiment

Next, a wiring substrate 1 according to the third embodiment will be described with reference to FIGS. 6A to 8C.

The wiring substrate 1 according to the third embodiment differs from the wiring substrate 1 according to the above-described embodiment in that, in a perspective plan view, via conductors 14 are located, on a one-to-one basis, on four corner sides of the insulating substrate 11 and that the wiring conductor 15 has a wiring conductor absent region 15a which surrounds a region located between the mounting portion 11a and the via conductors 14.

Figure 6A:
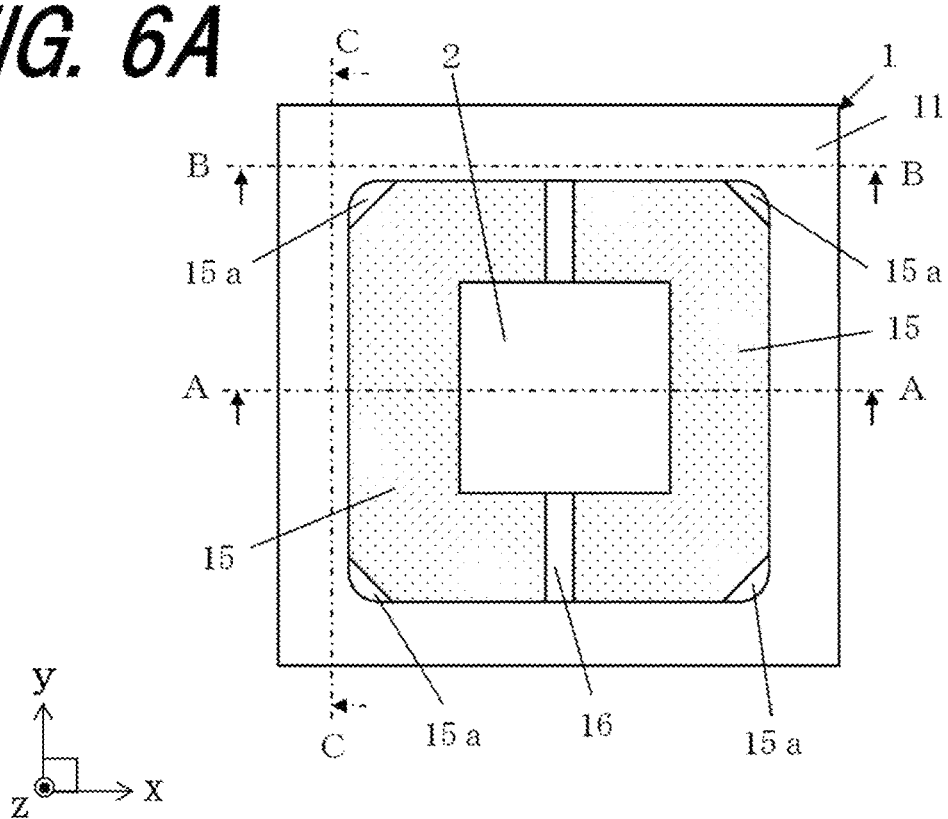
FIG. 6A is a top view illustrating an electronic device according to the third embodiment.
Figure 6B:
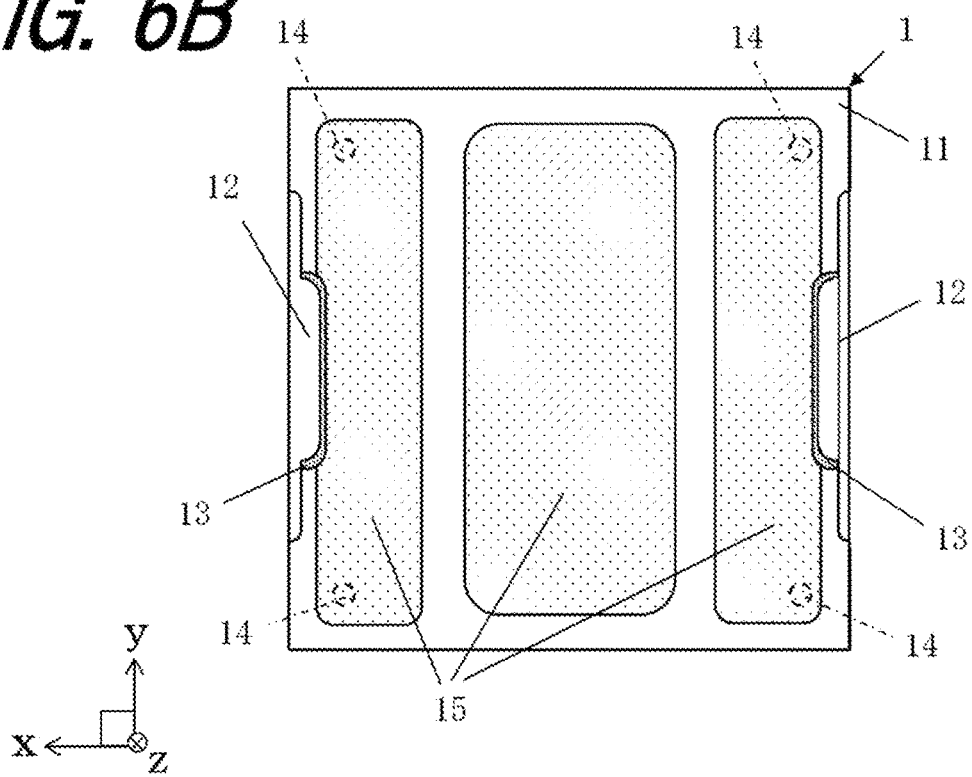
FIG. 6B is a bottom view of FIG. 6A.
Figure 7A:
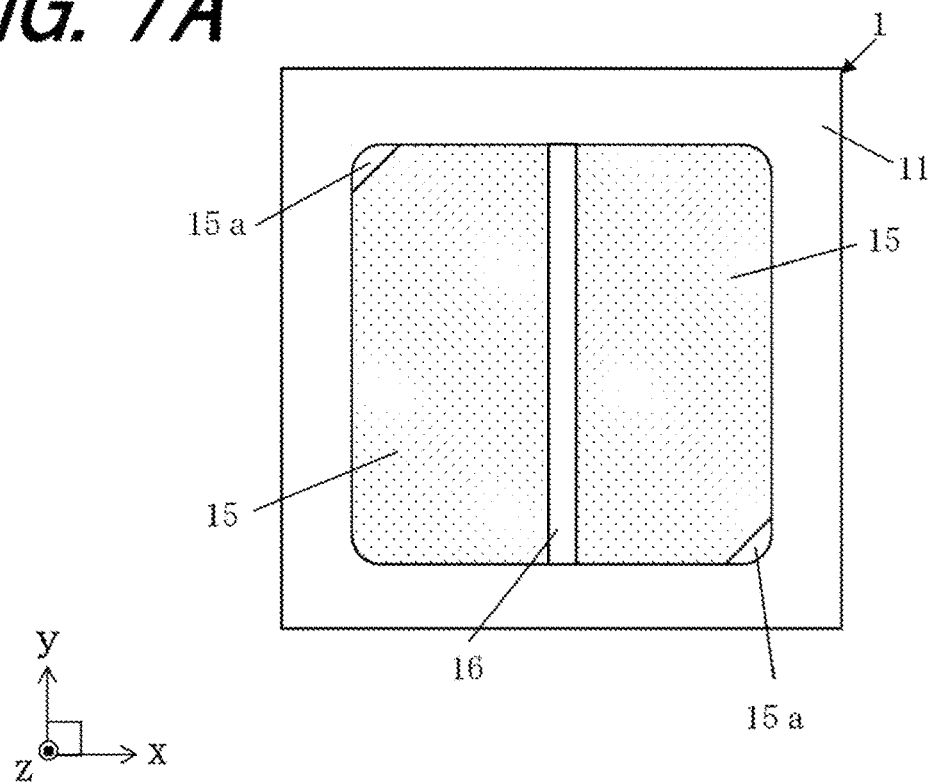
FIG. 7A is a top view illustrating a wiring substrate in the electronic device illustrated in FIGS. 6A and 6B.
Figure 7B:
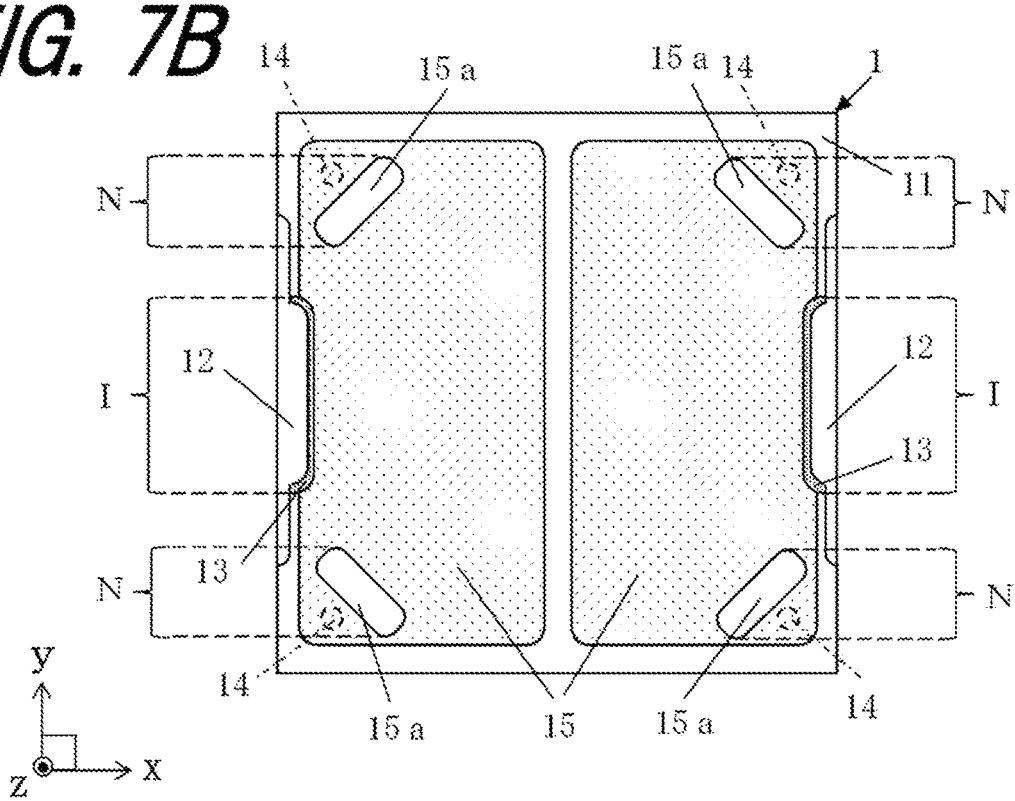
FIG. 7B is an internal top view of a wiring substrate in the electronic device illustrated in FIGS. 6A and 6B.
Figure 8A:
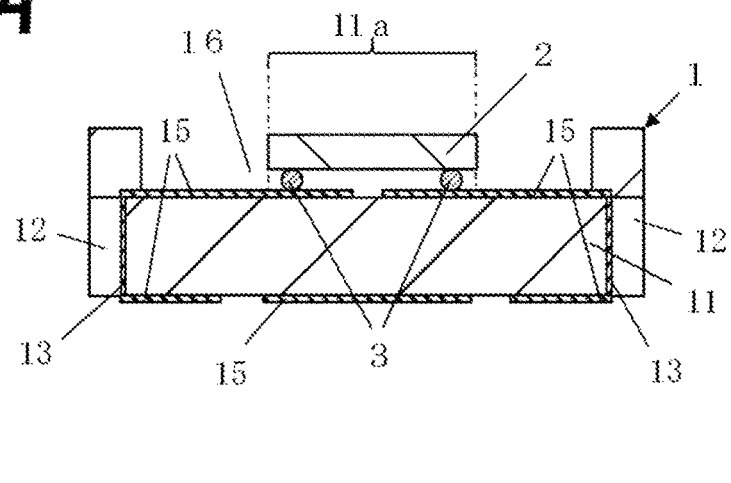
FIG. 8A is a cross-sectional view taken along the line A-A of the electronic device illustrated in FIG. 6A.
Figure 8B:
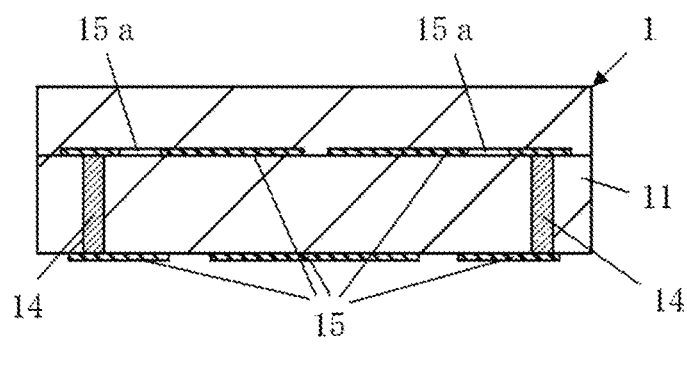
FIG. 8B is a cross-sectional view taken along the line B-B of the electronic device illustrated in FIG. 6A.
Figure 8C:
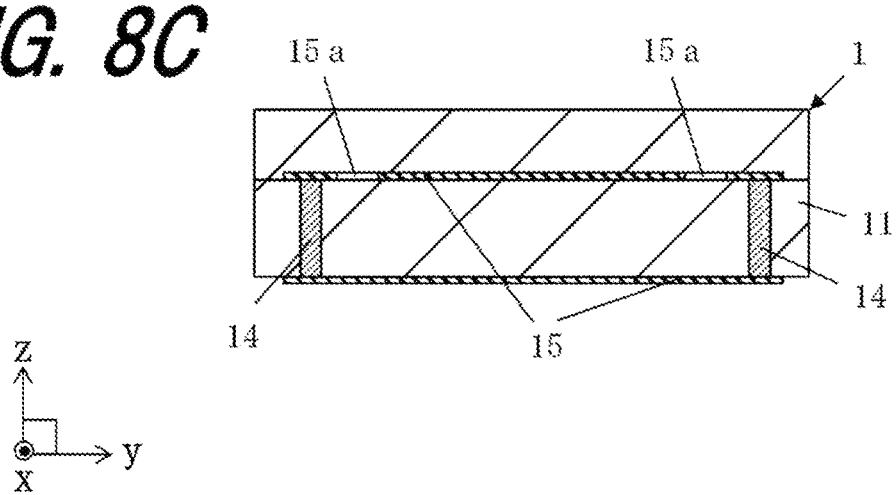
FIG. 8C is a cross-sectional view taken along the line C-C of the electronic device illustrated in FIG. 6A.

The inner surface electrode 13 is indicated in half-tone dot meshing in the examples illustrated in FIG. 6B and FIG. 7B. With regard to the via conductors 14, regions where the side surfaces of the via conductors 14 and the wiring conductor 15 overlap are indicated by a dotted line in the examples illustrated in FIG. 6B and FIG. 7B. The wiring conductor 15 is indicated in half-tone dot meshing in the examples illustrated in FIGS. 6A to 7B.

The wiring substrate 1 according to the third embodiment, as in the case of the wiring substrate 1 according to the above-described embodiments, allows heat of the electronic component 2 transferred through the wiring conductor 15 to be diffused and easily transferred in different directions toward the inner surface electrode 13 and toward the via conductor 14 and allows heat to be more easily transferred to the recess 12 side, while preventing heat transfer to the via conductor 14 side. This makes it possible to effectively prevent cracks from being produced between the inner surface electrode 13 and the via conductor 14, over a long-term use, due to heat transfer to the wiring conductor 15, the inner surface electrode 13, and the via conductor 14 and application of a current thereto.

Further, a configuration in which the via conductors 14 and wiring conductor absent regions 15a of the wiring conductor 15 are each located, on a one-to-one basis, at four corners of the wiring substrate 1, allows heat to be diffused and easily transferred in different directions toward the four via conductors 14, and, while preventing heat transfer to the sides of the individual via conductors 14, makes it possible to effectively prevent cracks from being produced between the inner surface electrode 13 and the via conductors 14, over a long-term use, due to heat transfer to the wiring conductor 15, the inner surface electrode 13, and the via conductors 14, and application of a current thereto.

Except for the points described above, the wiring substrate 1 according to the third embodiment can be manufactured by using a manufacturing method which is the same as the manufacturing method of the wiring substrate 1 according to the above-described embodiments.

The present disclosure is not limited to the examples of the above-described embodiments, and various modifications can be made. For example, the insulating substrate 11 may be shaped in a rectangle having a recess or a chamfer on the side surfaces thereof or at the corners thereof in a plan view.

The wiring substrate 1 according to the second embodiment and the wiring substrate 1 according to the third embodiment are such that, in a vertical cross-sectional view, the inner surface of the cavity 16 is formed to be perpendicular to the upper surface of the insulating substrate 11. Alternatively, the inner surface of the cavity 16 may be inclined so that an opening side of the cavity 16 is wider than a bottom surface side of the cavity 16.

Further, the wiring substrates 1 according to the first to third embodiments may be each combined with the configuration(s) of any of the other embodiment(s). For example, the wiring substrate 1 according to the first embodiment, as in the case of the wiring substrate 1 according to the third embodiment, may be such that the via conductor 14 and the wiring conductor absent region 15a of the wiring conductor 15 are each located on each of the sides of the four corners of the wiring substrate 1.

Further, the wiring substrate 1 according to the first embodiment, as in the case of the wiring substrate 1 according to the second embodiment and the wiring substrate 1 according to the third embodiment, may include the cavity 17.

Further, the wiring substrate 1 may be manufactured in the form of a multi-piece substrate.

The invention claimed is:

1. A wiring substrate comprising:
   an insulating substrate that is shaped in a quadrangle that extends along a X direction and a Y direction in a plan view, including a mounting portion where an electronic component is mounted on a side of a principal surface of the insulating substrate, and having a recess on a side surface wherein when viewed from the X direction, the recess is at a position overlapping the mounting portion;
   an inner surface electrode which is located on an inner surface of the recess;
   a via conductor which is located on a corner side of the insulating substrate in a perspective plan view and has both ends located in a thickness direction of the insulating substrate; and
   a wiring conductor, on the side of the principal surface of the insulating substrate, connecting the mounting portion, the inner surface electrode, and the via conductor with each other,
   wherein, in the perspective plan view, the wiring conductor has a wiring conductor absent region which surrounds a region located between the mounting portion and the via conductor, wherein the wiring conductor absent region is on the insulating substrate where the wiring conductor is not positioned and is surrounded by the wiring conductor when viewed from the thickness direction
   wherein when viewed from the X direction, the recess is positioned to not overlap with the wiring conductor absent region.

2. The wiring substrate according to claim 1, wherein in the perspective plan view, the wiring conductor is located in a region, on the corner side of the insulating substrate, where the via conductor is located.

3. The wiring substrate according to claim 1, wherein
in the perspective plan view, the inner surface electrode has a first part along one edge of the insulating substrate, and
the first part and an imaginary extension region formed by extending the wiring conductor absent region to a side of the one edge do not overlap.

4. The wiring substrate according to claim 1, wherein
in the perspective plan view, the via conductor is located on each of sides where edges forming corners of the insulating substrate are provided.

5. The wiring substrate according to claim 1, wherein
on an opposite side with respect to the mounting portion from the recess, the inner surface electrode, the via conductor, the wiring conductor, and the wiring conductor absent region, are located another recess, another inner surface electrode, another via conductor, another wiring conductor, and another wiring conductor absent region.

6. An electronic device comprising:
the wiring substrate according to of claim 1; and
the electronic component mounted on the wiring substrate.

7. An electronic module comprising:
a module substrate having a connection pad; and
the electronic device according to claim 6 connected to the connection pad via a solder.

8. The wiring substrate according to claim 2, wherein
in the perspective plan view, the inner surface electrode has a first part along one edge of the insulating substrate, and
the first part and an imaginary extension region formed by extending the wiring conductor absent region to a side of the one edge do not overlap.

9. The wiring substrate according to claim 2, wherein
in the perspective plan view, the via conductor is located on each of sides where edges forming corners of the insulating substrate are provided.

10. The wiring substrate according to claim 3, wherein
in the perspective plan view, the via conductor is located on each of sides where edges forming corners of the insulating substrate are provided.

11. The wiring substrate according to claim 2, wherein
on an opposite side with respect to the mounting portion from the recess, the inner surface electrode, the via conductor, the wiring conductor, and the wiring conductor absent region, are located another recess, another inner surface electrode, another via conductor, another wiring conductor, and another wiring conductor absent region.

12. The wiring substrate according to claim 3, wherein
on an opposite side with respect to the mounting portion from the recess, the inner surface electrode, the via conductor, the wiring conductor, and the wiring conductor absent region, are located another recess, another inner surface electrode, another via conductor, another wiring conductor, and another wiring conductor absent region.

13. The wiring substrate according to claim 4, wherein
on an opposite side with respect to the mounting portion from the recess, the inner surface electrode, the via conductor, the wiring conductor, and the wiring conductor absent region, are located another recess, another inner surface electrode, another via conductor, another wiring conductor, and another wiring conductor absent region.

14. An electronic device comprising:
the wiring substrate according to claim 2; and
the electronic component mounted on the wiring substrate.

15. An electronic device comprising:
the wiring substrate according to claim 3; and
the electronic component mounted on the wiring substrate.

16. An electronic device comprising:
the wiring substrate according to claim 4; and
the electronic component mounted on the wiring substrate.

17. An electronic device comprising:
the wiring substrate according to claim 5; and
the electronic component mounted on the wiring substrate.

18. The wiring substrate according to claim 1, wherein
the wiring conductor absent region is L-shaped when viewed from the thickness direction.

19. The wiring substrate according to claim 1, wherein
the wiring conductor absent region is L-shaped when viewed from the thickness direction,
when viewed from the Y direction, the wiring conductor absent region is at a position overlapping the via conductor,
when viewed from the X direction the wiring conductor absent region at a position overlapping the via conductor.

* * * * *